(12) United States Patent
Campbell et al.

(10) Patent No.: US 6,468,925 B2
(45) Date of Patent: Oct. 22, 2002

(54) PLASMA ENHANCED CHEMICAL VAPOR DEPOSITION PROCESS

(75) Inventors: Philip H. Campbell, Meridian, ID (US); Sujit Sharan, Boise, ID (US); Craig M. Carpenter, Boise, ID (US); Allen P. Mardian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/995,387

(22) Filed: Nov. 26, 2001

(65) Prior Publication Data

US 2002/0048963 A1 Apr. 25, 2002

Related U.S. Application Data

(62) Division of application No. 09/642,745, filed on Aug. 18, 2000.

(51) Int. Cl.[7] .............................................. H01L 21/31
(52) U.S. Cl. .................................. 438/771; 118/723 E
(58) Field of Search ............................... 438/728–732, 438/758, 712, 706, 715, 695, 96–97, 771, 788, 792, 798; 118/723 E

(56) References Cited

U.S. PATENT DOCUMENTS

| 4,891,488 A | * | 1/1990 | Davis et al. ................ 118/709 |
| 5,074,456 A |   | 12/1991 | Degner et al. .............. 228/121 |
| 5,252,178 A | * | 10/1993 | Moslehi ...................... 118/50.1 |
| 5,464,499 A | * | 11/1995 | Moslehi et al. ................ 134/1 |
| 6,073,577 A |   | 6/2000 | Lilleland et al. ............ 118/723 |
| 6,123,775 A |   | 9/2000 | Hao et al. .................... 118/724 |
| 6,235,646 B1 | * | 5/2001 | Sharan et al. ................ 427/569 |
| 6,245,192 B1 | * | 6/2001 | Dhindsa et al. ......... 156/345.34 |
| 6,302,966 B1 | * | 10/2001 | Bailey et al. ................ 118/712 |
| 6,415,736 B1 | * | 7/2002 | Hao et al. ................. 118/723 E |

* cited by examiner

Primary Examiner—David Nelms
Assistant Examiner—David Vu
(74) Attorney, Agent, or Firm—Wells St. John P.S.

(57) ABSTRACT

The invention includes a plasma enhanced chemical vapor deposition reactor, and a plasma enhanced chemical vapor deposition process. In one implementation, a plasma enhanced chemical vapor deposition reactor includes a deposition chamber having an electrically conductive RF powered showerhead support electrode. An electrically conductive gas distributing showerhead is mounted to the RF powered showerhead support electrode. A preformed electrically conductive gasket is interposed between the RF powered showerhead support electrode and the gas distributing showerhead. In one implementation, a plasma enhanced chemical vapor deposition process sequentially includes, a) in a first plurality of discrete depositions, plasma enhanced chemical vapor depositing material upon a plurality of semiconductor substrates within a chamber of a plasma enhanced chemical vapor deposition reactor; b) disassembling the reactor at least by separating an electrically conductive RF powered showerhead support electrode of the reactor and an electrically conductive gas distributing showerhead of the reactor from one another; c) sandwiching an electrically conductive material between the electrically conductive RF powered showerhead support electrode and the electrically conductive gas distributing showerhead during a reassembly of the reactor at least including connecting the electrically conductive RF powered showerhead support electrode and an electrically conductive gas distributing showerhead together; and d) in a second plurality of discrete depositions, plasma enhanced chemical vapor depositing material upon a plurality of semiconductor substrates within the chamber of the plasma enhanced chemical vapor deposition reactor.

11 Claims, 5 Drawing Sheets

PLASMA ENHANCED CHEMICAL VAPOR DEPOSITION PROCESS

CROSS REFERENCE TO RELATED APPLICATION

This application is a divisional of U.S. patent application Ser. No. 09/642,745, which was filed on Aug. 18, 2000 and which is incorporated by reference herein.

TECHNICAL FIELD

This invention relates generally to plasma enhanced chemical vapor deposition reactors, and to plasma enhanced chemical vapor deposition processes.

BACKGROUND OF THE INVENTION

RF plasma enhanced chemical vapor deposition reactors include a deposition chamber comprising an electrically conductive RF powered showerhead support electrode (in some devices, referred to as a gas box) and an electrically conductive gas distributing showerhead mounted thereto. RF power is conducted therebetween by the inherent electrically conductive nature of the materials from which such components are fabricated. The showerhead support electrode and gas distributing showerhead are typically bolted to one another. Gas feed to the showerhead is typically provided through the showerhead support electrode ultimately to the back of the showerhead. The showerhead support electrode and the showerhead are typically made of dissimilar materials. For example, a gas distributing showerhead might principally or entirely comprise nickel, whereas the showerhead support electrode might principally or entirely comprise aluminum. Good RF electrical contact between these two components is highly desirable to achieve good and consistent deposition when processing a series of wafers within the chamber.

During deposition, the showerhead and support electrode might be at different temperatures. Further, even if at the same elevated temperature, their different materials will typically have different thermal coefficients of expansion. Accordingly, the showerhead support electrode and the showerhead may warp or separate slightly from one another, resulting in degradation of the electrical connection therebetween. This can adversely bias the RF coupling therebetween and deteriorate the process performance of the deposition within the chamber.

It was discovered that after cleaning and reassembly of a plasma enhanced chemical vapor deposition reactor, such as described above, as many as 100 or more wafers will be processed within the chamber before repeatable and predictable depositions desirably occur within the chamber. It is theorized that the processing of such a large number of wafers where some separation between the showerhead and the showerhead support has occurred eventually results in plasma deposition of electrically conductive material within some or all of the space separating the showerhead and showerhead electrode due to differential expansion. This thereby results in a good, steady state RF electrical connection between the support and the showerhead. However, ultimately the reactor is disassembled for cleaning or other purposes, thereby resulting in poor electrical contact and deposition for a large number of wafers upon subsequent initial processing with the reactor. Further, the initial wafers may not have consistent and uniform deposition within the group, effectively causing a "break-in effect".

It would be desirable to overcome or improve upon the problems identified above. Although the invention was motivated primarily from this perspective, the artisan will appreciate applicability of the invention to plasma enhanced chemical vapor deposition processes and reactors independent of identification of or overcoming the above-identified problem, with the invention only being limited by the accompanying claims appropriately interpreted in accordance with the Doctrine of Equivalents.

SUMMARY

The invention comprises a plasma enhanced chemical vapor deposition reactor, and a plasma enhanced chemical vapor deposition process. In one implementation, a plasma enhanced chemical vapor deposition reactor includes a deposition chamber comprising an electrically conductive RF powered showerhead support electrode. An electrically conductive gas distributing showerhead is mounted to the RF powered showerhead support electrode. A preformed electrically conductive gasket is interposed between the RF powered showerhead support electrode and the gas distributing showerhead.

In one implementation, a plasma enhanced chemical vapor deposition process sequentially includes, a) in a first plurality of discrete depositions, plasma enhanced chemical vapor depositing material upon a plurality of semiconductor substrates within a chamber of a plasma enhanced chemical vapor deposition reactor; b) disassembling the reactor at least by separating an electrically conductive RF powered showerhead support electrode of the reactor and an electrically conductive gas distributing showerhead of the reactor from one another; c) sandwiching an electrically conductive material between the electrically conductive RF powered showerhead support electrode and the electrically conductive gas distributing showerhead during a reassembly of the reactor at least including connecting the electrically conductive RF powered showerhead support electrode and an electrically conductive gas distributing showerhead together; and d) in a second plurality of discrete depositions, plasma enhanced chemical vapor depositing material upon a plurality of semiconductor substrates within the chamber of the plasma enhanced chemical vapor deposition reactor.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
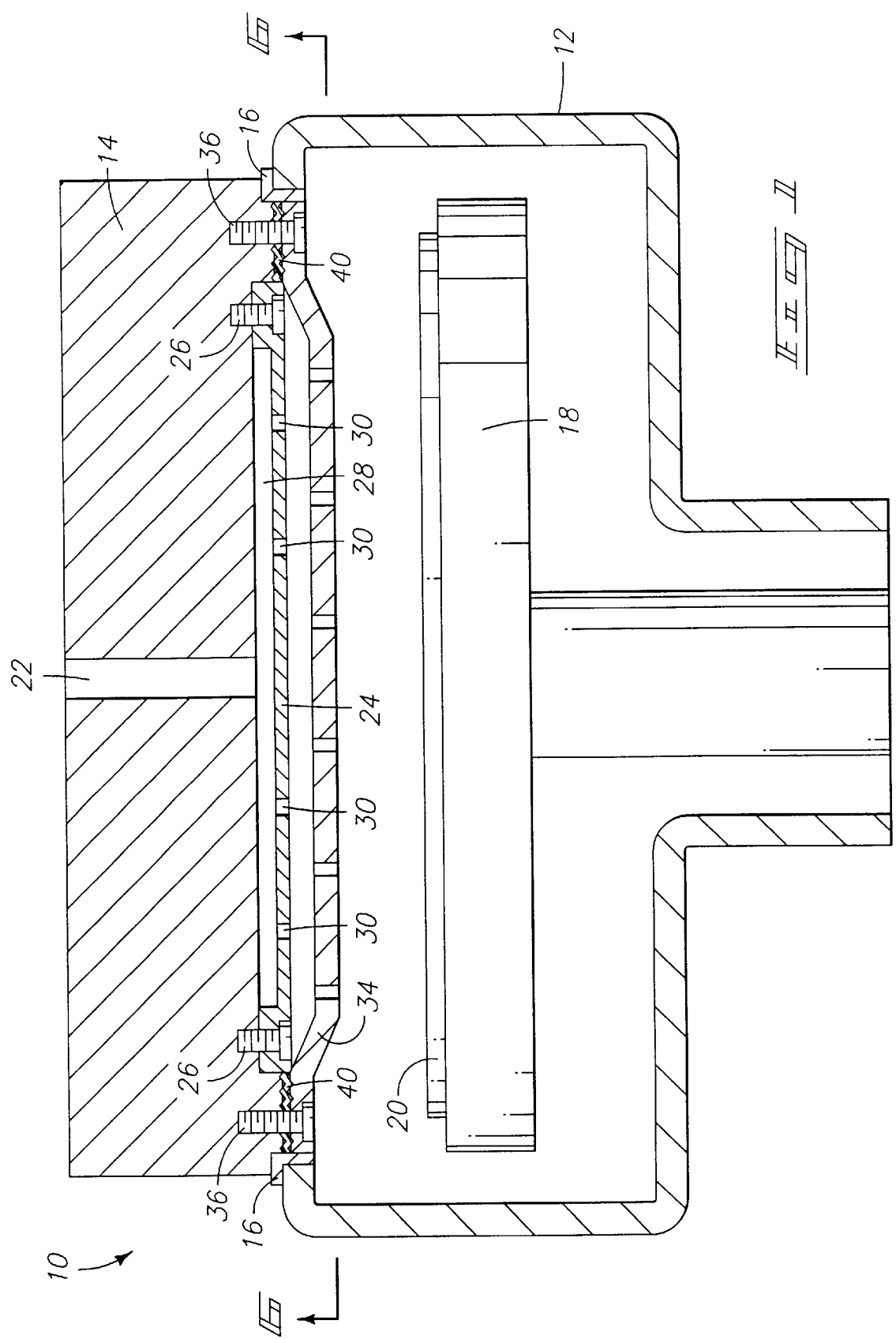
FIG. 1 is a diagrammatic sectional view of a plasma enhanced chemical vapor deposition reactor in accordance with an aspect of the invention.

This disclosure of the invention is submitted in furtherance of the constitutional purposes of the U.S. Patent Laws "to promote the progress of science and useful arts" (Article 1, Section 8).

Referring to FIGS. 1–4, 6 and 7, a plasma enhanced chemical vapor deposition reactor is indicated generally with reference numeral 10. Such comprises a deposition chamber 12 comprising an electrically conductive RF powered showerhead support electrode 14. Electrically conductive RF powered showerhead support electrode 14 would be connected with some suitable RF power source (not shown). Electrode 14 mounts to and is electrically isolated from chamber 12 through an electrically insulative seal 16. A susceptor/support 18 is received within chamber 12 as a cathode for the RF circuit and for supporting a semiconductor substrate 20 therein and upon which material is to be plasma enhanced chemical vapor deposited. Susceptor 18 can be suitably heated or cooled to enable maintaining substrate 20 at a desired backside temperature during deposition. Chamber 12 and showerhead support member 14 typically comprise the same material, such as conductive aluminum.

Figure 2:
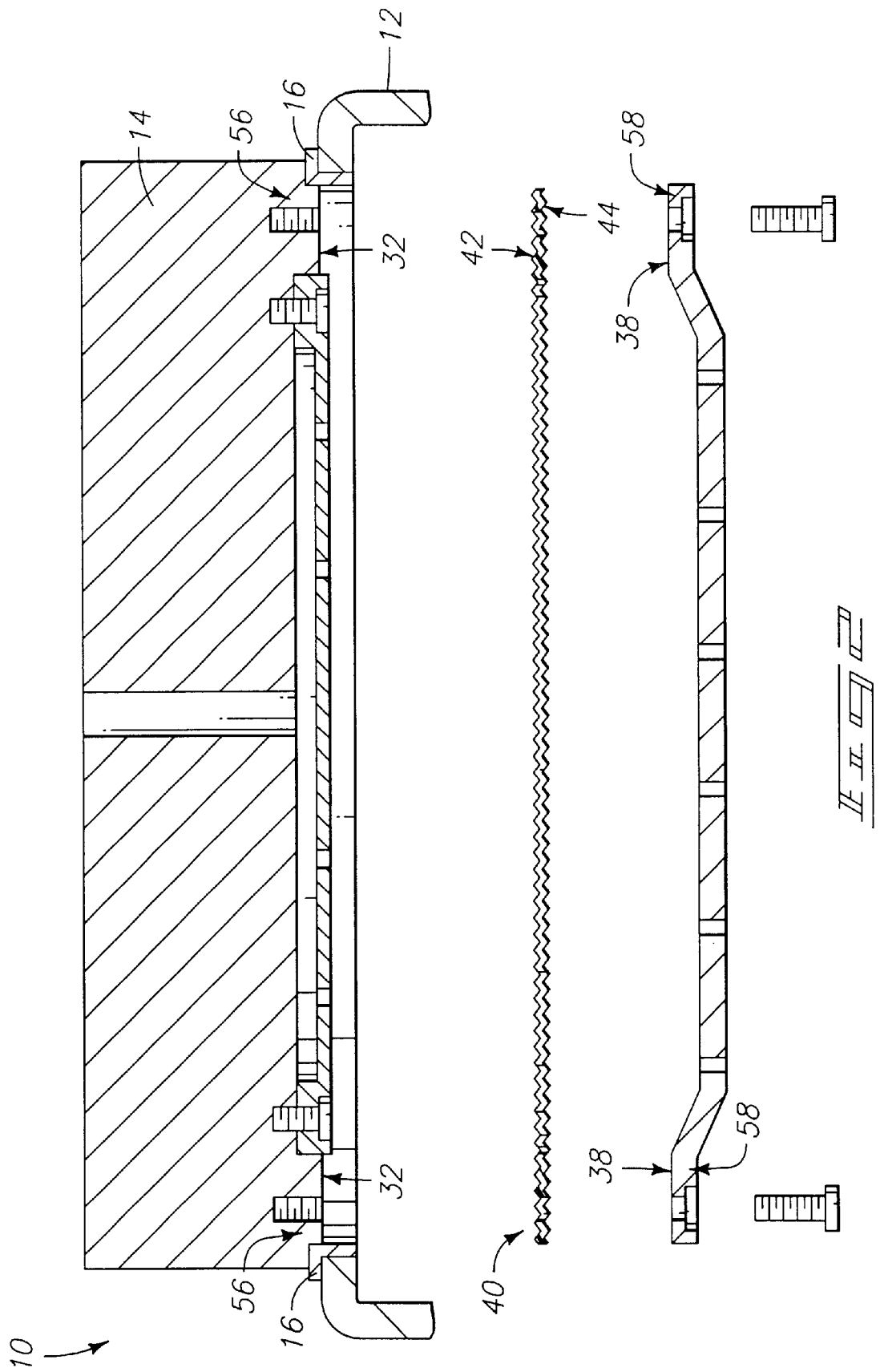
FIG. 2 is a partially exploded, enlarged view of a portion of the FIG. 1 reactor.

A gas inlet 22 is provided centrally through showerhead support electrode 14, extending vertically downward in the illustrated depiction in the direction of chamber 12. A blocker/diffuser plate 24 is bolted to the underside of showerhead support electrode 14 by a series of mounting bolts 26. Such is ideally suitably shaped and connected to be spaced beneath opening 22 to provide a void space 28 upstream of blocker plate 24. Blocker plate 24 is provided with a series of openings 30 therethrough which are laterally or radially displaced from alignment with opening 22. Gas is thereby ideally caused to flow to within void space 28 through opening 22, against backing plate 24 and diffuse laterally and radially thereacross prior to passing through openings 30 within blocker plate 24. For purposes of the continuing discussion, and only in accordance with but a preferred embodiment, showerhead support electrode 14 can be considered as comprising a mounting surface 32 (FIG. 2).

Figure 3:
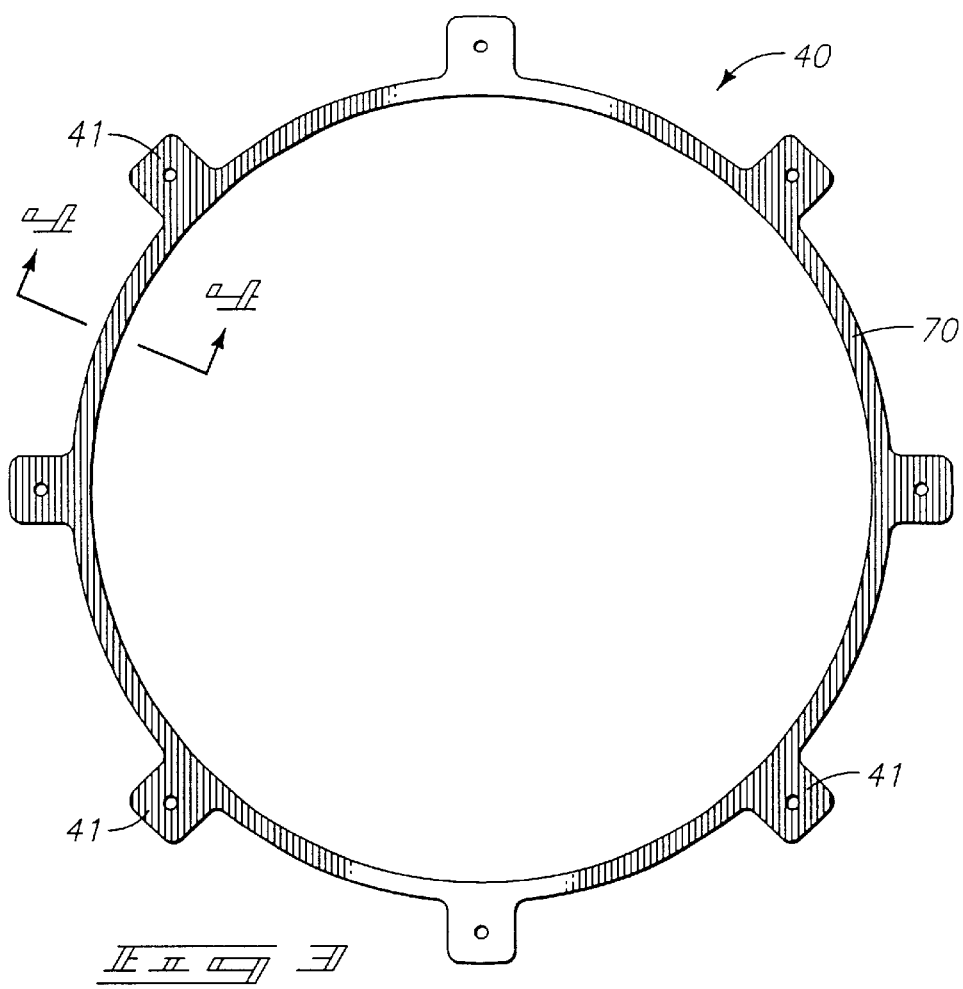
FIG. 3 is a diagrammatic top plan view of a preformed gasket utilized in the FIG. 1 reactor.
Figure 4:
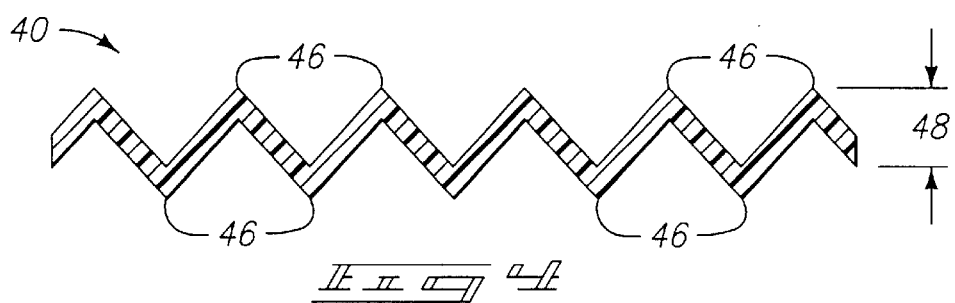
FIG. 4 is an enlarged diagrammatic sectional view of a portion of the preformed gasket utilized in FIG. 1.

An electrically conductive gas distributing showerhead 34 is mounted to RF powered showerhead support electrode 14 by a series of mounting bolts 36. For purposes of the continuing discussion, and in a preferred embodiment only, gas distributing showerhead 34 can be considered as having a mounting surface 38 (FIG. 2). A preformed electrically conductive gasket 40 is interposed between RF powered showerhead support electrode 14 and gas distributing showerhead 34. Such may or may not form a fluid-tight seal between showerhead support electrode 14 and showerhead 34. Preferably as shown, electrically conductive preformed gasket 40 contacts mounting surface 32 of RF powered showerhead support electrode 14 and mounting surface 38 of showerhead 34. In the illustrated and preferred embodiment, preformed gasket 40 is in the form of a continuous ring portion 70 having tab-like projections 41 extending therefrom. (FIG. 3)

Figure 5:
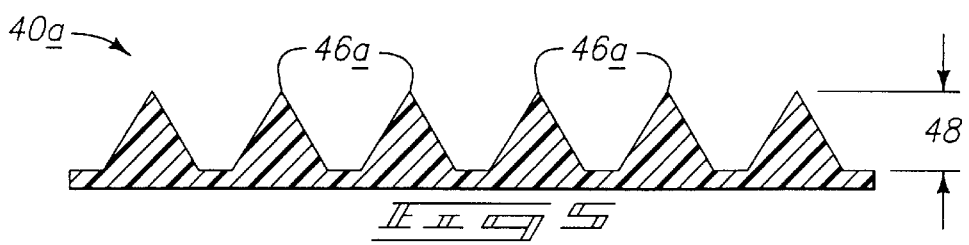
FIG. 5 is a diagrammatic sectional view of an alternate embodiment preformed gasket.
Figure 6:
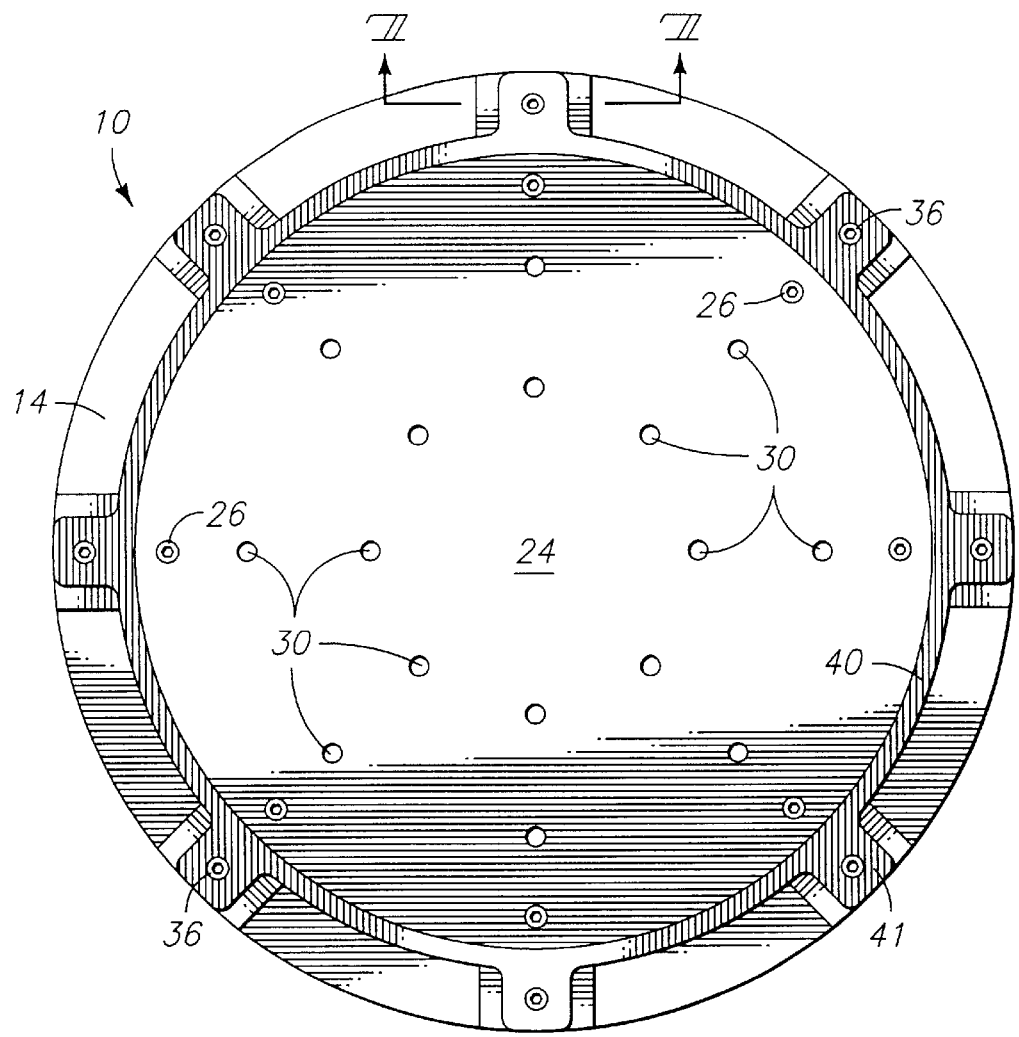
FIG. 6 is a diagrammatic partial view taken through line 6—6 in FIG. 1.
Figure 7:
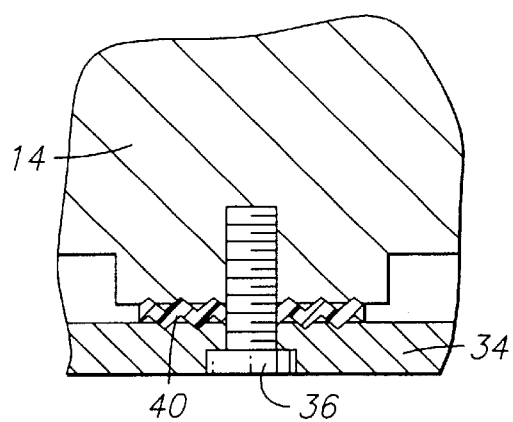
FIG. 7 is a diagrammatic sectional view taken through line 7—7 in FIG. 6.

In one implementation, preformed gasket 40 comprises a pair of opposing bearing surfaces 42, 44 (FIG. 2), which are respectively received against one of electrically conductive RF powered showerhead support electrode mounting surface 32 and electrically conductive gas distributing showerhead mounting surface 38. In the depicted first preferred embodiment, at least one of surfaces 42 and 44, and both such surfaces as shown, comprise a plurality of surface projections 46 (FIG. 4) having a projecting elevation 48 of at least two mils. More preferably, elevation 48 is at least 4 mils, and even more preferably 6 mils or greater. An exemplary thickness for the material of preformed gasket 40 is 2.5 mils. FIG. 5 illustrates an alternate embodiment gasket 40a having projections 46a extending from only one side of the preformed gasket. Projections 46 are preferably provided uniformly throughout the outer surfaces of gasket 40, including about the illustrated tabs 41 through which bolts 36 ultimately extend.

The plurality of projections 46 preferably penetrate into at least one of showerhead support electrode 14 and showerhead 34, and preferably into both as shown. Thereby during assembly or reassembly of the apparatus, such projections 46 result in deformation of and penetration into mounting surfaces 32 and 38 of the showerhead support electrode 14 and showerhead 34, respectively. The illustrated penetration in FIG. 1 is magnified for purposes of illustration. In but one implementation, penetration and/or deformation of mounting surfaces 32 and 38 is preferably accomplished by variable hardness amongst the materials at mounting surfaces 32 and 38, and the material of preformed gasket 40. For example, mounting surface 32 of showerhead support electrode 14 can be considered as comprising a mass of material proximate thereto comprised of some first hardness. Further, mounting surface 38 of showerhead 34 can be considered as comprising some proximate mass of second material of a second hardness which may be the same or different from the first hardness. Preformed electrically conductive gasket 34 preferably comprises a third material having a third hardness which is different from and greater than at least one, and preferably both, of the first and second hardnesses. Such will facilitate gasket 40 deforming at least one, and preferably both, of electrode mounting surface 32 and showerhead mounting surface 34, and in but one embodiment independent of whether projections 46 are present, as the components are bolted together with bolts 36.

Figure 9:
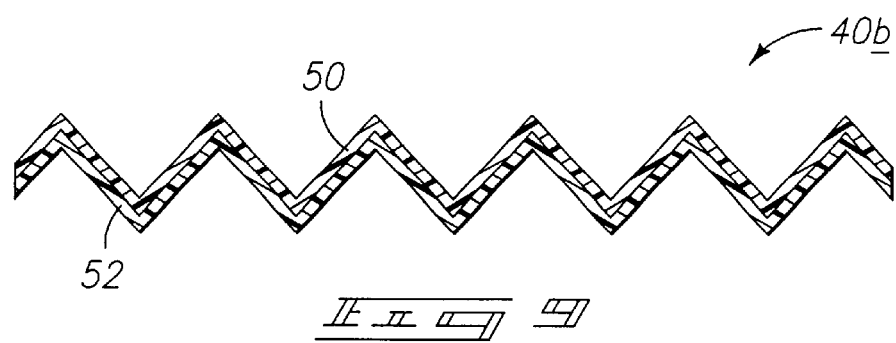
FIG. 9 is a diagrammatic sectional view of an alternate embodiment preformed gasket in accordance with an aspect of the invention.

In the preferred depicted embodiment, preformed electrically conductive gasket 40 is of a single layer, homogenous construction throughout. FIG. 9 depicts but one alternate embodiment preformed gasket 40b which is comprised of two different layer materials 50 and 52. Alternate constructions are of course contemplated.

Further preferably in accordance with but one aspect of the invention, showerhead support electrode 14 can be considered as comprising a mass 56 (FIG. 2) of material proximate preformed gasket 40 which comprises an average first thermal coefficient of expansion. Likewise, showerhead 34 can be considered as comprising a mass of material 58 (FIG. 2) proximate preformed gasket 40 comprising an average second thermal coefficient of expansion which is different from the average first thermal coefficient of expansion. Such is expected to typically be the case in most reactor designs wherein the showerhead support and showerhead are formed of predominantly different materials which may or may not be homogenous throughout the respective components. Preformed gasket 40 can also be considered as comprising a mass of material having an average third thermal coefficient of expansion which is different and intermediate the average first and second thermal coefficients of expansion. Such thermal coefficients of expansion relationship of the various materials is most preferred, in combination with the projection formation and hardnesses relationship (although in no way required), to facilitate continuous and consistent RF electrical contact between showerhead support electrode 14 and showerhead 40 from the beginning throughout the desired deposition steps upon a plurality of substrates.

The preferred projections in the form of alternating corrugations are principally shown as being in the form of pointed projections, although rounded or other configured dimpling is also contemplated in the context of the term "projections". The illustrated and preferred dimples or projections, whether harder or softer than the adjacent materials, can act as in a spring-like manner facilitating RF electrical connection between the subject components even if penetration does not occur, although penetration/deforming as described above is preferred.

The invention was reduced to practice whereby showerhead support electrode was formed to be substantially homogenous at least proximate the gasket and to comprise aluminum. The showerhead was homogeneously formed of nickel. The gasket homogeneously constituted 350 grade stainless steel. The thermal coefficients of expansion of aluminum, 350 grade stainless steel, and nickel are $25 \times 10^{6\circ}$ C., $17 \times 10^6/^\circ$ C., and $13 \times 10^6/^\circ$ C., respectively. The hardnesses of these same materials were 10 RC, 27 RC, and 23 RC, respectively, where "RC" refers to the Rockwell Hardness C scale. The elevational peak-to-peak distances between adjacent peaks 46 in the reduction-to-practice example was 14.5 mils., with individual peaks being 6 mils in elevation and homogenous gasket 40 being 2.5 mils. thick.

Figure 8:
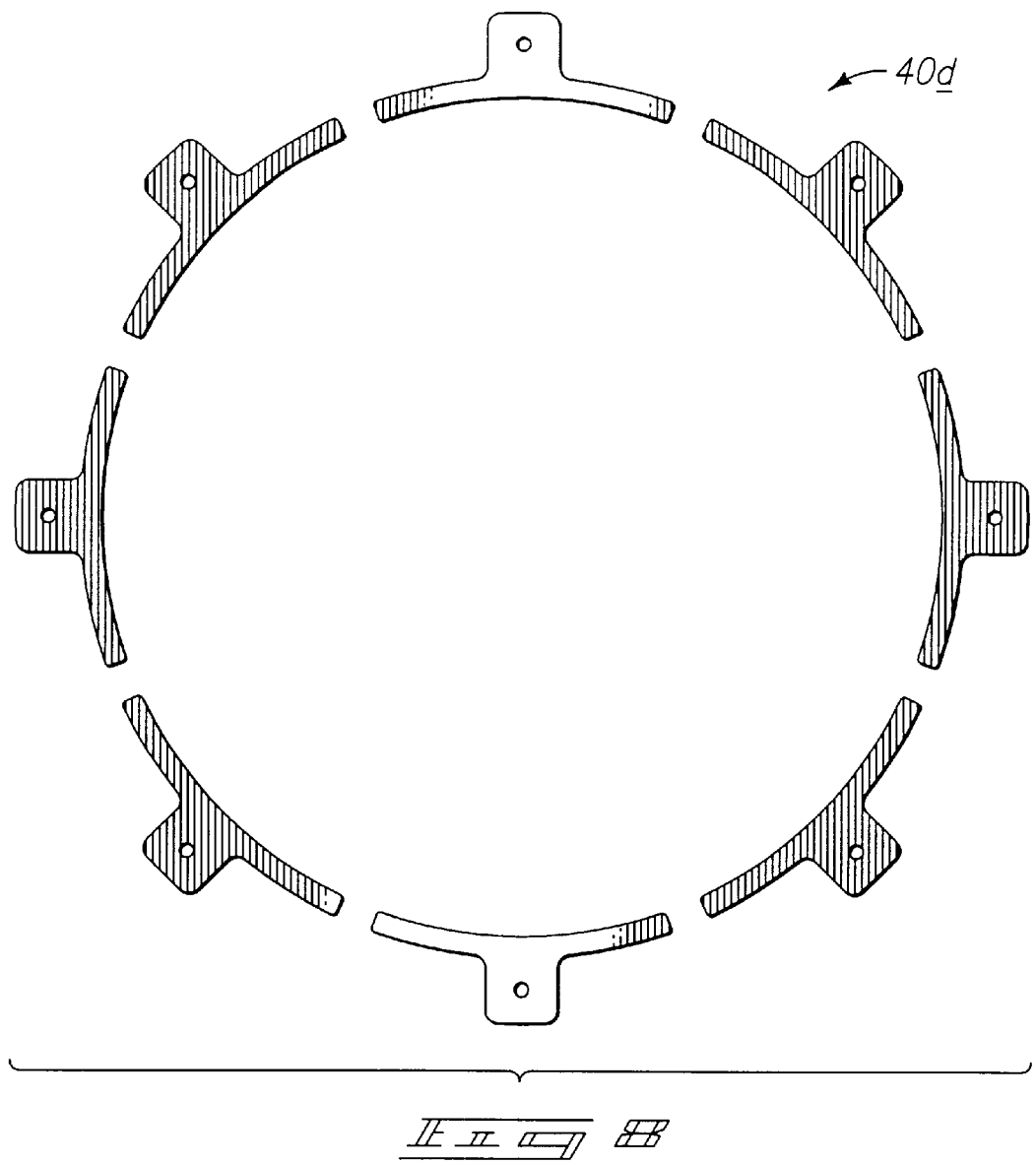
FIG. 8 is a diagrammatic top plan view of an alternate embodiment depiction of a preformed gasket in accordance with an aspect of the invention.

The illustrated and preferred gasket preferably comprises at least one continuous and completely encircling segment 70 (FIG. 3) which is received intermediate the showerhead support electrode and the showerhead. Alternately but less preferred, the preformed gasket could comprise a plurality of spaced segments, such as depicted by a lesser preferred alternate embodiment preformed gasket 40d in FIG. 8.

Also contemplated in the invention is a plasma enhanced chemical vapor deposition process involving a preformed electrically conductive gasket, for example as exemplified above by example only, and involving other conductive material which is not necessarily preformed. In the preferred methodical aspects of the invention, such sequentially comprises in a first plurality of discrete depositions, plasma enhanced chemical vapor depositing material upon a plurality of semiconductor substrates within a chamber of a plasma enhanced chemical vapor deposition reactor. In the illustrated and preferred embodiment, only a single semiconductor substrate is received within the chamber during each of the discrete depositions. Such discrete depositions might constitute only a few depositions, or perhaps numbering in the hundreds or thousands, or higher. Of course, the same or different substrates might be deposited upon during such plurality of discrete depositions.

At the conclusion of the first plurality of depositions, the reactor would be disassembled at least by separating an electrically conductive RF powered showerhead support electrode of the reactor (for example the electrode as described above) and an electrically conductive gas distributing showerhead of the reactor (for example, such as described above) from one another. The preformed gasket or other conductive material may or may not have been positioned intermediate such components during the first plurality of depositions, but preferably is. Typically, although in no way required, the reactor will then somehow be processed, such as by cleaning or replacing and repairing components. Thereafter, an electrically conductive material is sandwiched between the electrically conductive RF powered showerhead support electrode and the electrically conductive gas distributing showerhead during a reassembly of the reactor at least including connecting the electrically conductive RF powered showerhead support electrode and the electrically conductive gas distributing showerhead together. By way of example only, such sandwiching of electrically conductive material might include the above-described, or other, preformed electrically conductive gasket. Alternately, but less preferred, and by way of example only, such conductive material might constitute something which is not preformed, such as application of some suitable electrically conductive material paste, gel or other application substance. The surfaces of the electrode and showerhead making contact with the intervening conductive material are preferably cleaned prior to positioning of such conductive material, regardless.

Thereafter in a second plurality of discrete depositions, plasma enhanced chemical vapor depositing of material upon a plurality of semiconductor substrates within the chamber of the plasma enhanced chemical vapor deposition reactor is conducted. Of course, the substrates utilized may be the same or different substrates under the same or different conditions, and depositing the same or different materials.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A plasma enhanced chemical vapor deposition process sequentially comprising:

in a first plurality of discrete depositions, plasma enhanced chemical vapor depositing material upon a plurality of semiconductor substrates within a chamber of a plasma enhanced chemical vapor deposition reactor;

disassembling the reactor at least by separating an electrically conductive RF powered showerhead support electrode of the reactor and an electrically conductive gas distributing showerhead of the reactor from one another;

sandwiching an electrically conductive material between the electrically conductive RF powered showerhead support electrode and the electrically conductive gas distributing showerhead during a reassembly of the reactor at least including connecting the electrically conductive RF powered showerhead support electrode and an electrically conductive gas distributing showerhead together; and in a second plurality of discrete depositions, plasma enhanced chemical vapor depositing material upon a plurality of semiconductor substrates within the chamber of the plasma enhanced chemical vapor deposition reactor.

2. The process of claim 1 wherein only a single semiconductor substrate is received within the chamber during each of the discrete depositions of the first plurality.

3. The process of claim 1 wherein the material comprises a preformed gasket.

4. The process of claim 1 wherein the material comprises a plurality of spaced preformed gasket segments.

5. The process of claim 1 wherein the material comprises a preformed gasket, and the sandwiching comprises positioning the gasket against one of the electrically conductive RF powered showerhead support electrode and the electrically conductive gas distributing showerhead.

6. The process of claim 1 wherein the material is homogeneous.

7. The process of claim 1 wherein the material comprises at least two different material layers.

8. The process of claim 1 wherein the showerhead support electrode comprises a mass of material proximate the sandwiched electrically conductive material comprising an average first thermal coefficient of expansion, the showerhead comprises a mass of material proximate the sandwiched electrically conductive material comprising an average second thermal coefficient of expansion which is different from the average first thermal coefficient of expansion, and the sandwiched electrically conductive material comprises an average third thermal coefficient of expansion which is different and intermediate the average first and second thermal coefficients of expansion.

9. The process of claim 1 wherein the electrode comprises a mounting surface comprising a first material of a first hardness, the showerhead comprises a mounting surface comprising a second material of a second hardness, the sandwiched electrically conductive material comprising a third material having a third hardness which is different from and greater than at least one of the first and second hardnesses; and the sandwiching comprising deforming at least one of the electrode mounting surface and the showerhead mounting surface with the electrically conductive material during reassembly.

10. The process of claim 9 wherein the electrically conductive material has a pair of opposing bearing surfaces respectively received against one of the electrically conductive RF powered showerhead support electrode and the electrically conductive gas distributing showerhead, at least one of the pair of surfaces comprising a plurality of surface projections of at least 2 mils elevation, the deforming comprising penetrating the surface projections into the at least one of the electrode mounting surface and the showerhead mounting surface.

11. The process of claim 1 wherein the electrode comprises a mounting surface comprising a first material of a first hardness, the showerhead comprises a mounting surface comprising a second material of a second hardness, the sandwiched electrically conductive material comprising a third material having a third hardness which is different from and greater than at least one of the first and second hardnesses; and the sandwiching comprising deforming both of the electrode mounting surface and the showerhead mounting surface with the electrically conductive material during reassembly.

* * * * *

UNITED STATES PATENT AND TRADEMARK OFFICE
CERTIFICATE OF CORRECTION

PATENT NO. : 6,468,925 B2
DATED : October 22, 2002
INVENTOR(S) : Philip H. Campbell et al.

It is certified that error appears in the above-identified patent and that said Letters Patent is hereby corrected as shown below:

<u>Column 5,</u>
Line 17, please replace "and nickel are 25 x $10^{6o}$" with -- and nickel are 25 x $10^6/°$ --

Signed and Sealed this

Sixth Day of May, 2003

JAMES E. ROGAN
*Director of the United States Patent and Trademark Office*